United States Patent [19]

Robinson et al.

[11] 3,733,525

[45] May 15, 1973

[54] RF MICROWAVE AMPLIFIER AND CARRIER

[75] Inventors: Eugene A. Robinson, Dallas; Roy E. Shipley, Plano, both of Tex.

[73] Assignee: Collins Radio Company, Dallas, Tex.

[22] Filed: Mar. 20, 1972

[21] Appl. No.: 236,008

[52] U.S. Cl.........317/234 R, 317/234 G, 317/234 H, 174/DIG. 3, 338/84 M

[51] Int. Cl...............................H01l 3/00, H01l 5/00

[58] Field of Search..........................317/234, 4, 4.1, 317/101 C; 174/DIG. 3; 333/84 M

[56] References Cited

UNITED STATES PATENTS

| | | | |
|---|---|---|---|
| 3,387,190 | 6/1968 | Winkler | 317/234 |
| 3,489,956 | 1/1970 | Yanai et al. | 317/234 |
| 3,649,872 | 3/1972 | Garboushian | 317/234 |
| 3,651,434 | 3/1972 | McGeoush et al. | 317/234 |
| 3,681,513 | 8/1972 | Hargis | 317/234 |

*Primary Examiner*—John W. Huckert
*Assistant Examiner*—Andrew J. James
*Attorney*—Henry K. Woodward

[57] ABSTRACT

A power transistor and carrier advantageous for RF power (e.g. microwave) amplifier applications with improved linearity in class AB operation. The carrier comprises a channel-shaped member having a centrally located transistor mounting platform between two parallel rail members. One rail member includes a recessed plated portion for receiving base electrode wire bonds, and the other rail member includes a recessed portion including plating which is integrally contiguous with plating on the bottom surface of the carrier, whereby a resistive member may be mounted thereon with electrical contact to the bottom surface. The resistive member is low ohmage with high current capacity and is interconnected with the transistor emitter thereby insuring linear transistor operation by maintaining base-emitter junction forward bias, yet minimizes gain loss attendant with an emitter resistor.

3 Claims, 3 Drawing Figures

RF MICROWAVE AMPLIFIER AND CARRIER

This invention relates generally to semiconductor devices, and more particularly to an RF power transistor and carrier for same.

The use of semiconductor transistors in microwave radio frequency functions presents unique problems not encountered in lower frequency applications. Not only must the semiconductor device itself be designed for these ranges of frequency, but the mounting of the semiconductor device in the circuit must be compatible with the operating frequencies of the circuit. Heretofore, microwave frequency transistors and carriers, for example, have had limited bandwidth and gain due to inherent inductances in the mounting structure.

Further, to operate a microwave frequency transistor class AB for linear operation, the base-emitter junction must remain forward biased. This has been difficult to do since base-emitter stand-off voltage varies with temperature. Heretofore, attempts to alleviate the attendant transistor instability have entailed the use of complicated bias control circuits which have proved to be less than satisfactory.

An object of the present invention is an improved RF transistor circuit mounting for radio frequency power amplification.

Another object of the invention is a combination of transistor, emitter resistor, and carrier therefor which provides wide-band frequency matching in radio frequency power applications.

Still another object of the invention is a microwave transistor carrier which offers wire bond protection during device testing and handling.

Features of the invention include in combination with a transistor and low ohmage resistor, a carrier comprising a channel-shaped member including a centrally located mounting platform between two parallel rail members. One rail member includes a recessed plated portion for receiving base electrode wire bonds, and the other rail member includes a recessed portion including plating which is integrally contiguous with plating on the bottom surface of the carrier, whereby a resistive member may be mounted thereon with electrical contact to the bottom surface.

Operationally, the low ohmage semiconductor resistor mounted to the recessed portion of the second arm receives wire bonds from the emitter electrode of the RF power transistor. To achieve low ohmage and uniform current distribution through the resistor, a doped semiconductor member includes a plurality of heavily doped regions on one major face which provide contacts to the resistor.

These and other objects and features of the invention will be more fully understood from the following detailed description and appended claims when taken with the drawings, in which:

Figure 1:
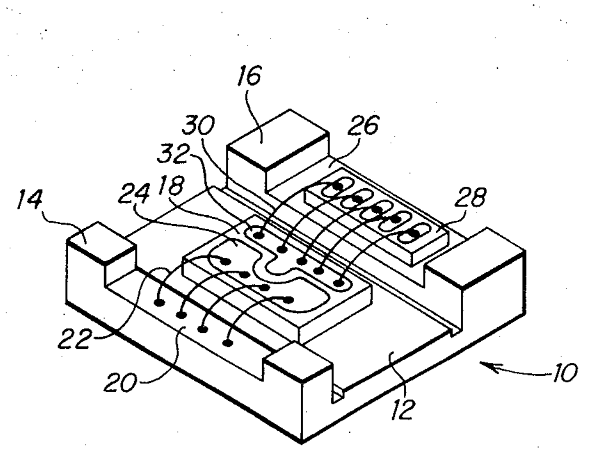
FIG. 1 is a perspective view of an RF power amplifier transistor and carrier in accordance with the present invention.

Referring now to the drawings, FIG. 1 is a perspective view of an RF transistor and carrier in accordance with the present invention. The carrier 10 includes a centrally located recessed plated platform portion 12 lying between rail members 14 and 16. Mounted on platform potion 12 is an RF power transistor 18 with the collector electrode in electrical contact with platform portion 12.

For high power applications carrier 10 is preferably beryllia, while at lower power alumina is satisfactory.

Rail 14 includes a recessed portion 20 on which is plated a conductive layer such as gold and which receives a plurality of conductive wires 22 interconnecting base electrode 24 of transistor 18 to the recessed area 20. Besides providing protection to the transistor and wire bonds the pedestals of this rail provide a means of carrier RF testing and connecting of the device to the circuit.

Figure 2:
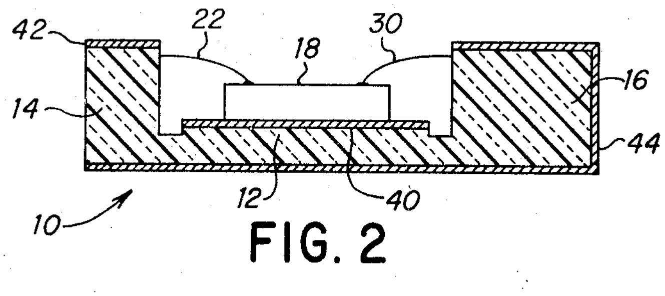
FIG. 2 is a side view of the transistor and carrier of FIG. 1.

Similarly, arm 16 includes a recessed portion 26 on which a layer of gold is plated and which is integrally contiguous with a gold layer on the bottom surface of carrier 10 (shown in FIG. 2). Mounted on recessed surface 26 is a low ohmage resistor 28, described in more detail below with reference to FIG. 3. Conductive wires 30 interconnect the emitter electrode 32 of transistor 18 and resistor 28.

FIG. 2 is a side view of carrier 10 and illustrates in more detail the mounting of transistor 18 thereon and the various metal plating. Mounting platform 12 is plated with a layer of gold or other suitable conductive material which provides electrical contact to the collector element of transistor 18. Advantageously, circuit electrical interconnection may be provided to the transistor collector electrode by bonded wires or ribbon attached to layer 40 on both sides of transistor 18, thereby more uniformly distributing the current through the collector electrode.

Another conductive metal layer 42 is provided on arm 14 and covers the recessed portion of the arm as well as the raised pedestals on either side of the recessed portion. Similarly, gold layer 44 is provided on arm 16 and is integrally contiguous around one side and on the bottom of carrier 10.

It will be appreciated that the interconnecting wires 22 and 30 are protected by the carrier arm pedestals whereby the carrier may be turned upside down for test purposes prior to connecting the transistor in circuit.

Figure 3:
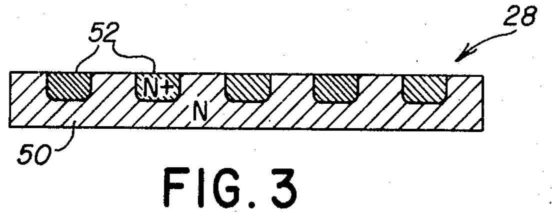
FIG. 3 is a section view of a resistive element included in the transistor circuit and carrier of FIG. 1.

FIG. 3 is a section view of resistor 28 and includes a doped semiconductor bar 50 of N-type conductivity with a plurality of heavily doped regions 52 diffused into the bar from one major surface. Advantageously current distribution is achieved by providing interconnecting wires from the transistor emitter to each of the heavily doped regions whereby a plurality of resistors are effectively formed in the bar and are connected in parallel. Thus, assuming that the resistance from each heavily doped region to the bottom surface of bar 50 is 1 ohm, the effective resistance of the resistor 28 is 0.2 ohm. The resulting low ohmage, high current capacity resistor minimizes gain loss attendant with an emitter resistor.

The described power transistor and carrier combination has proved advantageous in high frequency applications in permitting wider frequency range of linear operability. While the invention has been described with reference to a specific embodiment, the description is illustrative and not to be construed as limiting the invention. Various modifications and changes may occur to those skilled in the art without departing from the spirit and scope of the invention as defined by the appended claims.

We claim:

1. In combination, an RF power amplifier and mounting carrier comprising a transistor, a low ohmage high current capacity resistor, a channel shaped member, said channel shaped member having a centrally located mounting platform between two parallel rail members, each of said two parallel rail members having a recessed portion, said transistor being mounted on said platform with the collector of said transistor in contact therewith, conductor means interconnecting the base of said transistor with said recessed portion of one of said rail members, said resistor mounted on said recessed portion of the other of said rail members, conductor means interconnecting the emitter of said transistor to said resistor, a bottom conductive layer on the major surface of said channel shaped member opposite said platform, a conductive layer on said platform for contact with said collector, a conductive layer on said recessed portion of said one rail member for receiving said base interconnecting conductor means, a conductive layer on said recessed portion of said other rail member for receiving said resistor and contiguous with said bottom conductive layer, and said recessed portions defining pedestals on each of said rail members which provide protection for said conductor means and which receive the conductive layer of each respective recessed portion to facilitate electrical test of said combination.

2. The combination as defined by claim 1 wherein said resistor comprises a doped semiconductor member with a plurality of heavily doped regions on one major face with provide contacts to said resistor.

3. An RF power transistor carrier and circuit mount comprising an insulative channel shaped member, said channel shaped member having a centrally located mounting platform between two parallel rail members, each of said two parallel rail members having a recessed portion lying between two pedestals, a conductive metal layer on said platform for receiving a transistor, a bottom conductive metal layer of the major surface of said member opposite said platform, a conductive metal layer on one of said rail members including said recessed portion and said two pedestals, and a conductive metal layer on the other of said rail members including said recessed portion and said two pedestals and contiguous with said bottom conductive layer.

* * * * *